(12) United States Patent
Audette et al.

(10) Patent No.: US 8,836,356 B2
(45) Date of Patent: Sep. 16, 2014

(54) VERTICAL PROBE ASSEMBLY WITH AIR CHANNEL

(75) Inventors: David M. Audette, Colchester, VT (US); Dustin M. Fregeau, South Burlington, VT (US); David L. Gardell, Fairfax, VT (US); Daniel J. Murphy, Essex Junction, VT (US); Grant Wagner, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 13/323,001

(22) Filed: Dec. 12, 2011

(65) Prior Publication Data

US 2013/0147502 A1   Jun. 13, 2013

(51) Int. Cl.
*G01R 31/10* (2006.01)

(52) U.S. Cl.
USPC .................. 324/750.08; 324/750.14

(58) Field of Classification Search
None
See application file for complete search history.

(56) References Cited

U.S. PATENT DOCUMENTS

| | | | |
|---|---|---|---|
| 4,027,935 A | 6/1977 | Byrnes et al. |
| 5,207,585 A | 5/1993 | Byrnes et al. |
| 5,325,052 A | 6/1994 | Yamashita |
| 5,977,787 A | 11/1999 | Das et al. |
| 6,196,866 B1 | 3/2001 | Gaschke |
| 6,523,255 B2 | 2/2003 | Shih et al. |
| 6,529,021 B1 | 3/2003 | Yu et al. |
| 6,963,207 B2 | 11/2005 | Root et al. |
| 2007/0018676 A1 | 1/2007 | Rittberger et al. |
| 2007/0132469 A1 | 6/2007 | Yano |
| 2007/0229103 A1 | 10/2007 | Tani |
| 2007/0279075 A1 | 12/2007 | Root et al. |
| 2008/0048700 A1 | 2/2008 | Lou et al. |
| 2010/0182013 A1 * | 7/2010 | Lou |

FOREIGN PATENT DOCUMENTS

JP        06097242 A  *  4/1994  ............ H01L 21/66

* cited by examiner

*Primary Examiner* — Minh N Tang
(74) *Attorney, Agent, or Firm* — Cantor Colburn LLP; Michael LeStrange

(57) ABSTRACT

A vertical probe assembly includes an upper die; a lower die; a plurality of probes, the probes including an electrically conductive material, wherein the probes extend from the upper die through the lower die; and an air channel located between the upper die and the lower die, such that airflow through the air channel passes through the plurality of probes.

14 Claims, 5 Drawing Sheets

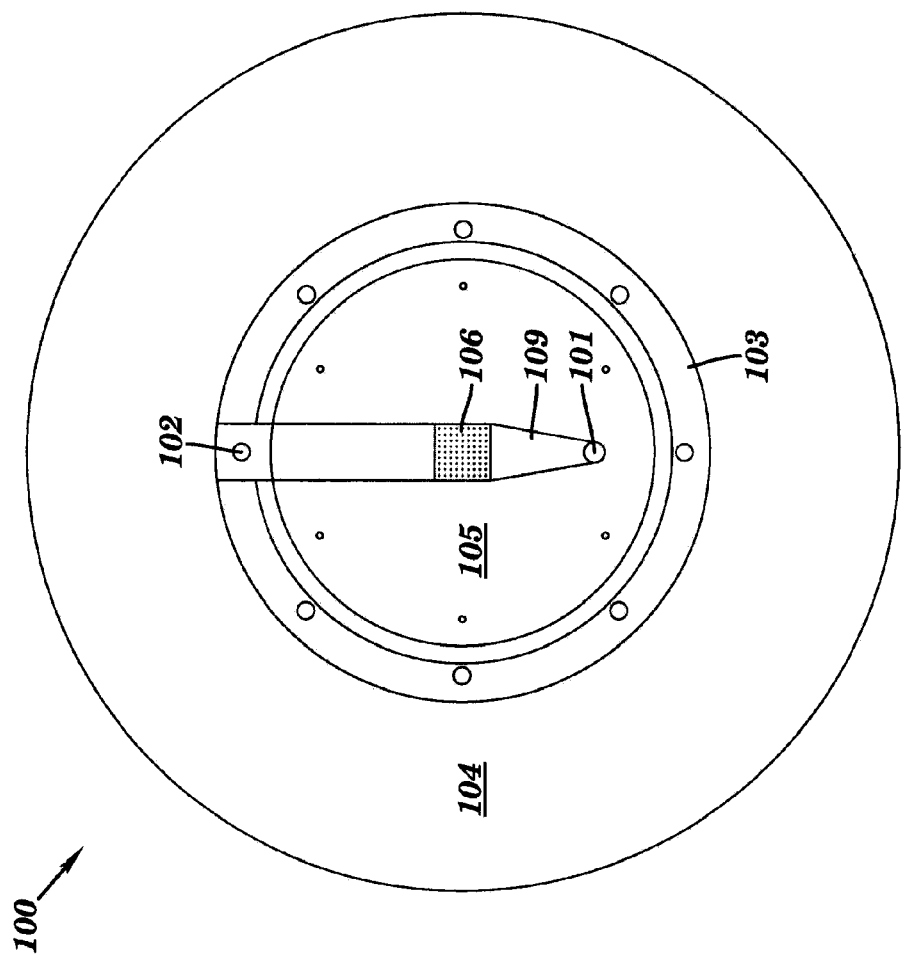

VERTICAL PROBE ASSEMBLY WITH AIR CHANNEL

BACKGROUND

This disclosure relates generally to the field of semiconductor device testing, and more particularly to a vertical probe assembly for semiconductor device testing.

Semiconductor devices, also referred to as integrated circuit (IC) chips, are electrically interconnected for such purposes as testing, burn-in, and utilization. Interconnection methods include rigid probes and contacts, flexible probes and contacts, wire bonding, soldering, and welding. The topology of the interconnections on a chip may vary from a line or linear array of peripherally spaced pads, bumps, or contacts, to an area array of two dimensionally spaced pads or bumps. The pads of bumps in either a linear or area array normally have a uniform width and center-to-center spacing in the array. The array of contacts in an area array are usually arranged in a pattern such as rows and columns orthogonal to one another. The trend in IC chips is for denser arrays of contacts and for more contacts per chip.

IC chips are typically tested at the wafer level, before the wafer is diced into individual IC chips. At the wafer level more than one chip may be tested at one time. In some cases individual chips are tested and burned in. In order to make temporary contact with high-density arrays of contacts on many IC chips sequentially at relatively high speeds for testing or burn-in of the IC chips, a probe assembly may be used. One type of probe assembly used for this purpose is a vertical probe assembly. An example of a vertical probe assembly is described in U.S. Pat. No. 4,027,935, which was granted on Jun. 7, 1977 to Byrnes et al., and which is herein incorporated by reference in its entirety. A vertical probe assembly has a plurality of conductive probe wires (referred to hereinafter as probes) mounted in parallel, with the ends of the probes ending in a plane transverse to the axis of the wires. The probe ends are shaped to facilitate making electrical contact to the contacts of an IC. Each probe is sufficiently rigid to apply pressure to a corresponding contact on the IC to form good electrical contact, yet flexible or springy enough to prevent excessive pressure on or deformation of the contact. When the probes in the probe assembly are aligned correctly, the ends are floating and the cumulative pressure exerted by the probes is sufficient with respect to the area of the contacts to form electrical connections with all of the contacts on the IC. Insufficient pressure may result in a lack of electrical contact with some contacts on the IC, while excess pressure from the vertical probe assembly on the contacts may damage the IC.

During testing or burn-in of an IC using a vertical probe assembly, the probes in the vertical probe assembly and contacts on the IC may experience relatively high currents caused by high test or burn in voltages. The high currents can cause overheating and may damage the vertical probe assembly or the IC. Faulty contacts discovered during burn-in or testing may be incorrectly attributed to a failure in the IC itself, instead of to an error with the vertical probe assembly, and an IC that contains a faulty contact may be discarded without further testing. This may lead to reduced yield for a semiconductor manufacturing process.

BRIEF SUMMARY

In one aspect, a vertical probe assembly includes an upper die; a lower die; a plurality of probes, the probes comprising an electrically conductive material, wherein the probes extend from the upper die through the lower die; and an air channel located between the upper die and the lower die, such that airflow through the air channel passes through the plurality of probes.

In another aspect, a method of using a vertical probe assembly includes causing airflow to flow through an air channel in the vertical probe assembly, the air channel being located between an upper die and a lower die of the vertical probe assembly, the vertical probe assembly further comprising a plurality of probes, the probes comprising an electrically conductive material and extending from the upper die through the lower die, and wherein the airflow through the air channel passes through the plurality of probes.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 1C is a bottom view illustrating an embodiment of a vertical probe assembly with an air channel with the lower die removed.

DETAILED DESCRIPTION

Figure 1A:
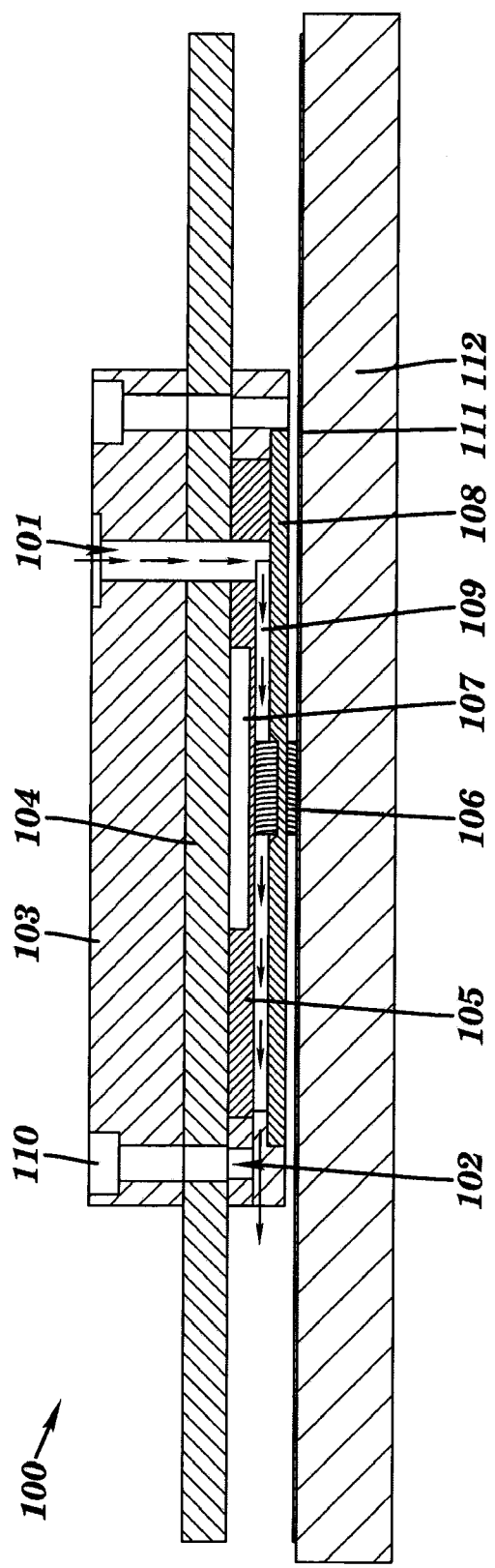
FIG. 1A is a cross sectional view illustrating an embodiment of a vertical probe assembly with an air channel.

Embodiments of a vertical probe assembly with an air channel, and a method of using a vertical probe assembly with an air channel, are provided, with exemplary embodiments being discussed below in detail. IC testing and burn-in using a vertical probe assembly is limited by the amount of current that may be carried per probe, as the probes may overheat at higher currents, resulting in damage to the contacts on the IC, the probes, or the vertical probe assembly. Therefore, a vertical probe assembly may include an air channel between an upper die and a lower die of a vertical probe assembly. Airflow may be forced through this air channel across the probes. This may cool the probes, preventing damage to the vertical probe assembly and to the IC under test while allowing higher current per probe to be applied to the IC under test in some embodiments. In various embodiments, the airflow in the air channel may comprise any appropriate gas or dielectric liquid, including but not limited to ionized air, nitrogen gas, or liquid nitrogen.

Additionally, in other embodiments involving IC testing that is performed at a specified temperature, probes are typically soaked before the start of testing, otherwise alignment between the probe array and IC under test may shift as testing proceeds and the probe temperature approaches the test temperature. Probe soak time adds time and expense to the testing process because no IC is actually being tested during the probe soak step. Therefore, to obviate the need for probe soaking, air may be forced through the air channel that is at a specified temperature, such that the probes are brought to the test temperature relatively quickly at the start of the testing. This prevents heat transfer between the IC and the probes during testing, which may affect the alignment of the contacts on the IC and/or the probes. The temperature of the air that is forced through the air channel may be the same as the test temperature in some embodiments. The testing may be testing at an elevated temperature in some embodiments, and the air that is forced through the air channel may be heated air.

The probes extend through the upper and lower dies of the vertical probe assembly, and the air channel comprises a gap between upper and lower dies. Airflow may be forced through the air channel across the probes. One or more holes may be provided in the upper die or lower die for the air inlet and/or outlet. The speed, volume, and temperature of the airflow may be controlled based on the testing or burn-in conditions. The airflow through the channel may be provided by compressed air and/or a vacuum in various embodiments.

The probes in a vertical probe assembly have a current limit, i.e., a maximum amount of current that may be conducted in the probe without damage to the probe or an IC that is contacted by the probe. The center area of the probe may overheat due to excessive current; which may result in a loss of spring rate, height, force or electrical resistance on the affected probes. The amount of current needed per probe during testing or burn-in increases as chip power during regular usage increases. Some chips may also need to be stress tested to ensure that the chip will stand up to a wide variety of operating conditions. Stress testing may include usage of a vertical probe assembly at elevated currents, temperatures, voltages, and/or frequencies. Addition of the air channel between the upper and lower die increases the current limit of the vertical probe assembly by dissipating the heat that builds up during use of the probe. A probe's current limit may be significantly increased with even relatively small airflow across the probe through the air channel. The air channel therefore allows for testing or burn-in under a relatively wide range of conditions without damage to the IC or the vertical probe assembly. Increasing the probe current limit also means fewer probes are required to test a given device, resulting in significant cost savings and reduced probing force.

FIG. 1A is a cross sectional view illustrating an embodiment of vertical probe assembly 100. Vertical probe assembly 100 includes an air channel 109 located between an upper die 105 and a lower die 108. Vertical probe assembly 100 further includes a stiffener 103, a printed circuit board 104, a substrate 107, and probes 106. The probes 106 extend from the substrate 107, through the upper die 105, through the air channel 109, and through the lower die 108 to the bottom of the vertical probe assembly 100. The probes 106 may comprise any appropriate number of conductive wires. The upper and lower dies 105 and 108 may be plastic, ceramic, or silicon in various embodiments. The substrate 107 comprises a space transformer and may be ceramic, organic, or silicon in various embodiments. The substrate 107 may also be incorporated directly into the printed circuit board 104; in such an embodiment the substrate 107 is referred to as a footprint on board. The substrate 107 may also be incorporated into the upper die in some embodiments. The stiffener 103 may also be incorporated directly into the printed circuit board 104 in some embodiments. The probes 106 make contact with contacts on an IC that is located below the probes 106 of the vertical probe assembly 100 during testing or burn-in; the IC may be held in place by a vacuum in some embodiments. The IC may be part of a wafer 111 that includes a plurality ICs, as shown in FIG. 1A. The probes 106 may be used to test the plurality of ICs on the wafer 111 before the wafer is diced into individual ICs. The wafer 111 may be supported by a wafer chuck 112 during testing of the ICs on the wafer 111 using the probes 106. The wafer chuck 112 may comprises a rigid support for the wafer 111, and may be copper in some embodiments. Air channel 109 is located between the upper die 105 and the lower die 108, and airflow through the air channel 109 passes through the probes 106.

The air channel 109 of FIG. 1A is shown with an air inlet 101 and air outlet 102; these are shown for illustrative purposes only. In some embodiments, the air outlet of an air channel 109 may be located on top of the upper die 105 at alternate air outlet 110 instead of at air outlet 102. Air inlet 101 and alternate air outlet 110 comprise holes that are formed in the top of the upper die 105, and air outlet 102 comprises a hole in the side of the vertical probe assembly 100. In additional embodiments, the air inlet or outlet may comprise a hole through the lower die 108, which may be located, for example, underneath air outlet 102. Airflow in air channel 109 is indicated by arrows in FIG. 1A, which are also shown for illustrative purposes only. The airflow may flow in the opposite direction as is indicated by the arrows in air channel 109 in some embodiments. The airflow may be provided by compressed air or a vacuum. The compressed air or vacuum that causes the airflow in air channel 109 may be provided at the air inlet 101, air outlet 102, or alternate air outlet 110 in various embodiments. Compressed air enables relatively high flows at a more controlled temperature, while a vacuum may provide a self cleaning action to the probes 106. In some embodiments, a positive pressure (i.e., compressed air) may be applied at air inlet and while a negative pressure (i.e., a vacuum) is also be applied at the air outlet. In various embodiments, the airflow in the air channel 109 may comprise any appropriate gas or dielectric liquid, including but not limited to ionized air, nitrogen gas, or liquid nitrogen. Additionally, in some embodiments, air may flow from the air channel 109 thru the holes in the upper and/or lower dies 105/108 through which the probes 106 extend.

Figure 1B:
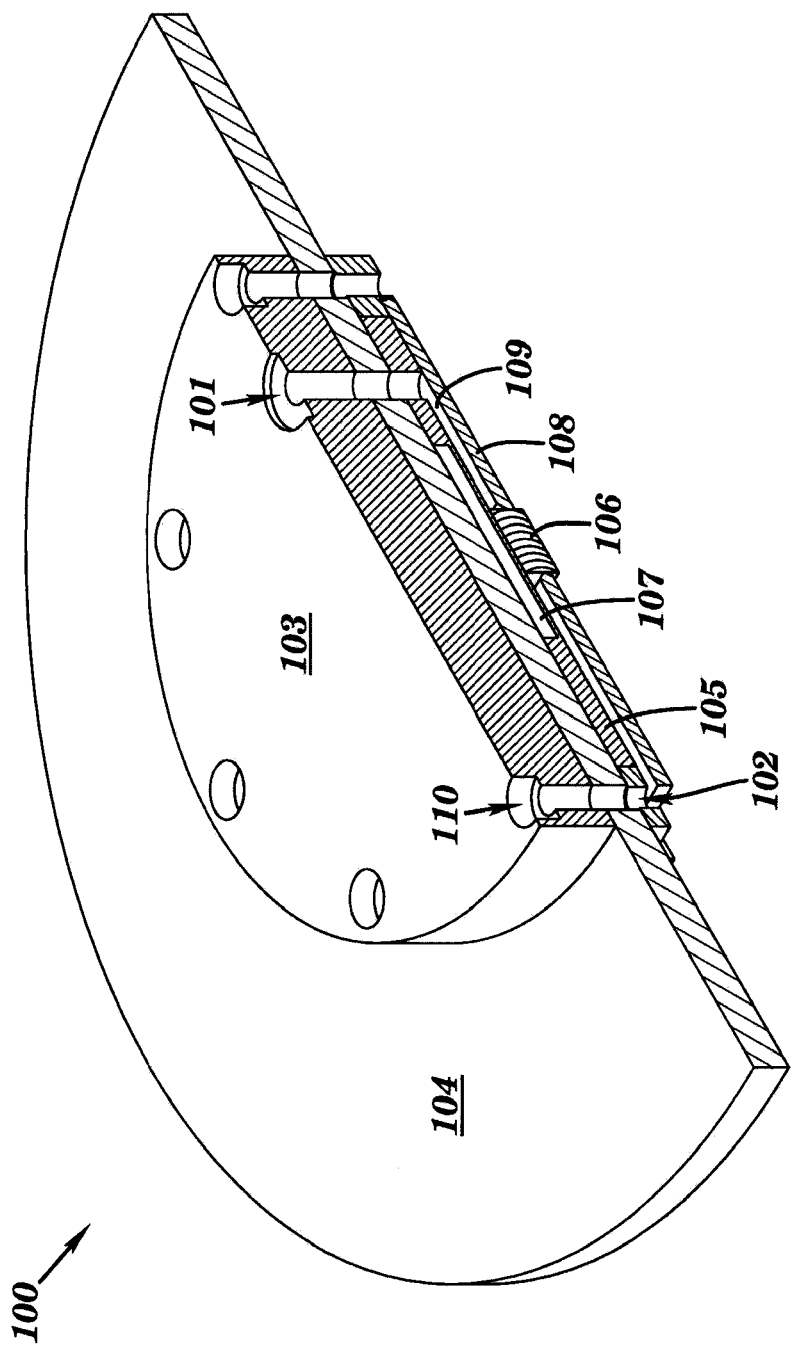
FIG. 1B is an isometric cross sectional view illustrating an embodiment of a vertical probe assembly with an air channel.

The vertical probe assembly 100 of FIG. 1A is shown in further detail with respect to FIGS. 1B-C. FIG. 1B is an isometric cross sectional view illustrating the vertical probe assembly 100 with an air channel 109, and FIG. 1C is a bottom view illustrating the vertical probe assembly 100 with an air channel 109 with the lower die 108 removed.

Figure 2A:
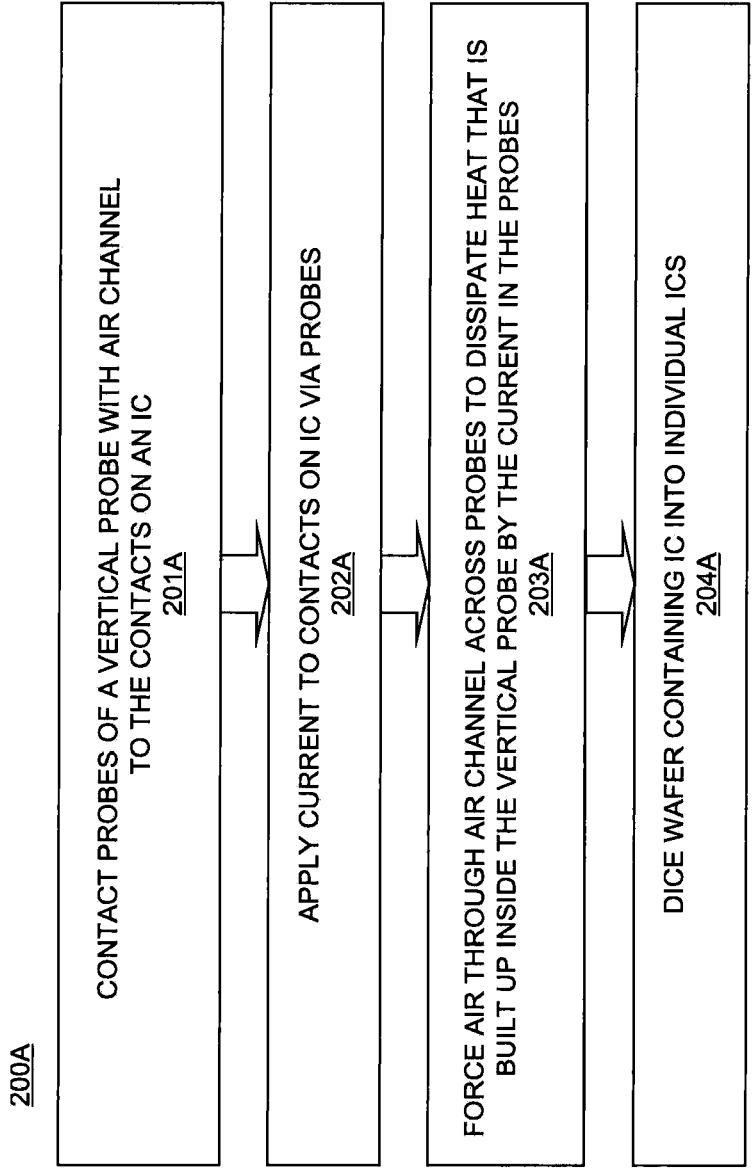
FIGS. 2A-B are flowcharts illustrating embodiments of methods of using a vertical probe assembly with an air channel.
Figure 2B:
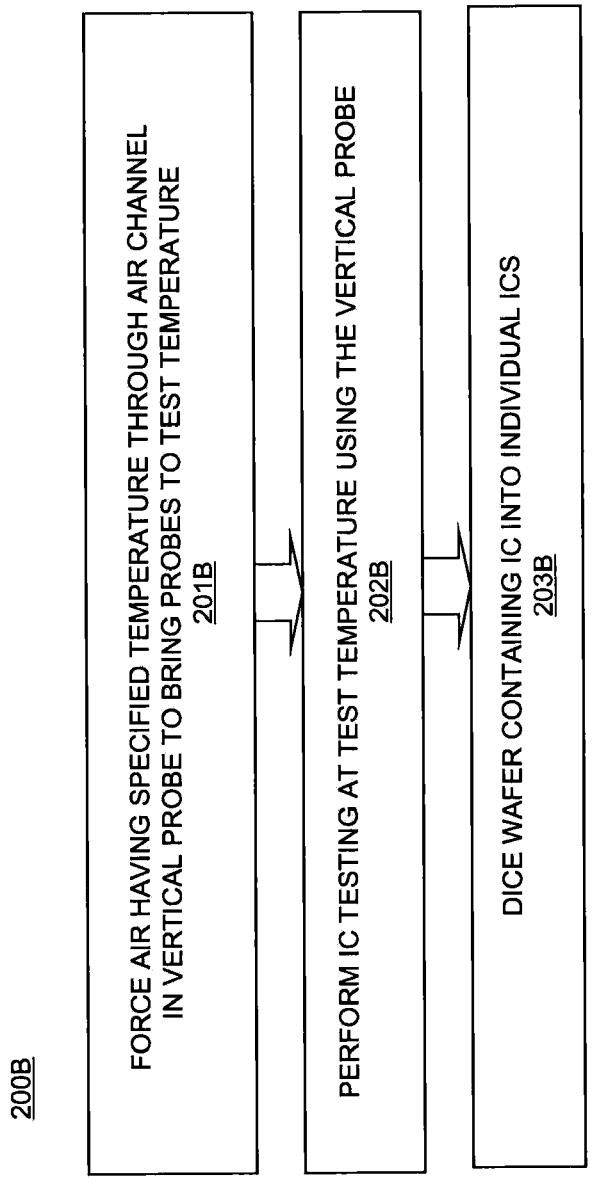

FIGS. 2A-B are flowcharts illustrating embodiments of methods of using a vertical probe assembly with an air channel, such as vertical probe assembly 100 of FIGS. 1A-C. FIG. 2A relates usage of the air channel to dissipate heat that is built up around the probes inside the vertical probe assembly from current flow in the probes during testing, while FIG. 2B relates to elimination of a probe soak step for testing that is performed using the vertical probe assembly at a specified temperature.

Turning to FIG. 2A, a method 200A for using a vertical probe assembly such as vertical probe assembly 100 of FIGS. 1A-C having an air channel 109 is shown. FIG. 2A is discussed with reference to FIGS. 1A-C. In block 201A, the probes 106 of the vertical probe assembly 100 are contacted to contacts on an IC. The IC may be held in place by a vacuum in some embodiments. In other embodiments, the IC may be part of a wafer, such as wafer 111 as shown in FIG. 1A, that includes a plurality of ICs, and that is held in place by a wafer chuck 112. Then, in block 202A, current is applied to the contacts on the IC via the probes 106. The current in the probes 106 causes heat to build up around the probes 106 inside the vertical probe assembly 100 between the upper die 105 and the lower die 108. Then, in block 203A, air is forced through the air channel 109 to dissipate the heat around the probes 106 that is built up between the upper die 105 and the lower die 108 of the vertical probe assembly 100 during the testing or burn-in. In some embodiments, the airflow through air channel 109 may commence before the IC is contacted to the probes 106 and current is supplied to the IC via the probes 106. The speed, volume, and temperature of the airflow in air channel 109 may be controlled based on the testing or burn-in conditions. The airflow through the air channel 109 may be provided by compressed air and/or a vacuum in various embodiments, and may be applied at any appropriate location with respect to the air channel 109 in various embodiments. In various embodiments, the airflow in the air channel may comprise any appropriate gas or dielectric liquid, including but not limited to ionized air, nitrogen gas, or liquid nitrogen. Lastly, in block 204A, in embodiments in which the vertical probe assembly 100 is used in conjunction with ICs on a wafer before dicing of the wafer, the vertical probe assembly 100 is used to test or burn-in the plurality of ICs on the wafer, and after testing or burn-in using the vertical probe assembly 100 is completed, the wafer is diced into individual ICs. ICs on the wafer that were determined to be faulty may then be discarded.

Turning to FIG. 2B, a method 200B for using a vertical probe assembly such as vertical probe assembly 100 of FIGS. 1A-C having an air channel 109 across the probes is shown. FIG. 2B is also discussed with reference to FIGS. 1A-C. In block 201B, air having a specified temperature is forced through the air channel 109 to bring the vertical probe assembly 100 including probes 106 and upper die 108 to a steady state temperature that will not fluctuate significantly, thereby ensuring stable alignment between the probes 106 and the IC during testing. The speed, volume, and temperature of the airflow in air channel 109 may be controlled based on the testing conditions. The airflow through the air channel 109 may be provided by compressed air and/or a vacuum in various embodiments, and may be applied at any appropriate location with respect to the air channel 109 in various embodiments. In various embodiments, the airflow in the air channel may comprise any appropriate gas or dielectric liquid, including but not limited to ionized air, nitrogen gas, or liquid nitrogen. Then, in block 202B, testing of an IC is performed using the vertical probe assembly 100 with the probes 106 at the test temperature. During the testing current is applied to the contacts on an IC that are contacted to the probes 106 via the probes 106. In some embodiments, the IC may be part of a wafer, such as wafer 111 as shown in FIG. 1A, that includes a plurality of ICs, and that is held in place by a wafer chuck 112. Lastly, in block 203B, in embodiments in which the vertical probe assembly 100 is used in conjunction with ICs on a wafer before dicing of the wafer, the vertical probe assembly 100 is used to test a plurality of ICs on the wafer, and after testing using the vertical probe assembly 100 is completed, the wafer is diced into individual ICs. ICs on the wafer that were determined to be faulty may then be discarded.

For an example vertical probe assembly having an air channel between the upper die and the lower die, the probe current limit may be significantly increased as compared to a vertical probe assembly without such an air channel, especially for a vertical probe assembly having a relatively large number of densely-arrayed probes for contacting ICs having similarly densely-arrayed contacts, as such a configuration may have significant heat buildup inside the vertical probe assembly. The increase in the current limit may be about 200% for an example vertical probe assembly that includes single probe, or up to about 400% for an example vertical probe assembly that includes an array of 3000 probes.

The technical effects and benefits of exemplary embodiments include a vertical probe assembly having a relatively high current limit and elimination of the need for presoaking.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A vertical probe assembly, comprising:
   an upper die;
   a lower die;
   a plurality of probes, the probes comprising an electrically conductive material, wherein the probes extend from a lower surface of a space transformer that is located directly on top of a top surface of the upper die through the upper die, and through the lower die, wherein the probes do not extend through the space transformer; and
   an air channel located between the upper die and the lower die, such that airflow through the air channel passes through the plurality of probes, wherein the air channel extends through the upper die, and comprises an air inlet comprising a hole located in the top surface of the upper die, and an air outlet comprising a hole located in the top surface of the upper die.

2. The vertical probe assembly of claim 1, further comprising compressed air located at the air inlet, the compressed air being configured to cause the airflow in the air channel.

3. The vertical probe assembly of claim 1, further comprising a vacuum located at the air outlet, the vacuum being configured to cause the airflow in the air channel.

4. The vertical probe assembly of claim 1, further comprising compressed air located at an air inlet of the air channel and a vacuum located at an air outlet of the air channel, the compressed air and the vacuum being configured to simultaneously cause the airflow in the air channel.

5. The vertical probe assembly of claim 1, further comprising a current flowing through the probes to a plurality of contacts located on an integrated circuit, wherein the airflow is configured to dissipate heat that is caused by the current from between the upper die and the lower die inside the vertical probe assembly.

6. The vertical probe assembly of claim 1, wherein the airflow is configured to bring the probes to a specified test temperature for testing of an integrated circuit.

7. The vertical probe assembly of claim 1, wherein the airflow in the air channel comprises one of ionized air, nitrogen gas, and liquid nitrogen.

8. A method of using a vertical probe assembly, the method comprising:

causing airflow to flow through an air channel in the vertical probe assembly, the air channel being located between an upper die and a lower die of the vertical probe assembly, the vertical probe assembly further comprising a plurality of probes, the probes comprising an electrically conductive material and extending from a lower surface of a space transformer that is located directly on top of a top surface of the upper die through the upper die, and through the lower die to the IC, wherein the probes do not extend through the space transformer, and wherein the airflow through the air channel passes through the plurality of probes, wherein the air channel extends through the upper die, and comprises an air inlet comprising a hole located in the top surface of the upper die, and an air outlet comprising a hole located in the top surface of the upper die.

9. The method of claim 8, further comprising compressed air located at the air inlet, the compressed air being configured to cause the airflow in the air channel.

10. The method of claim 8, further comprising a vacuum located at the air outlet, the vacuum being configured to cause the airflow in the air channel.

11. The method of claim 8, further comprising compressed air located at an air inlet of the air channel and a vacuum located at an air outlet of the air channel, the compressed air and the vacuum being configured to simultaneously cause the airflow in the air channel.

12. The method of claim 8, further comprising a current flowing through the probes to a plurality of contacts located on an integrated circuit, wherein the airflow is configured to dissipate heat that is caused by the current from between the upper die and the lower die inside the vertical probe assembly.

13. The method of claim 8, wherein the airflow is configured to bring the probes to a specified test temperature for testing of an integrated circuit.

14. The method of claim 8, wherein the airflow in the air channel comprises one of ionized air, nitrogen gas, and liquid nitrogen.

* * * * *